(12) United States Patent
Kurakami et al.

(10) Patent No.: US 7,480,345 B2
(45) Date of Patent: Jan. 20, 2009

(54) SEMICONDUCTOR INTEGRATED CIRCUIT FOR COMMUNICATION, RADIO-COMMUNICATION APPARATUS, AND TRANSMISSION STARTING METHOD

(75) Inventors: Noriyuki Kurakami, Maebashi (JP); Patrick Wurm, Comberton (GB); Robert Astle Henshaw, Sudbury (GB); David Freeborough, Balsham (GB)

(73) Assignees: Renesas Technology Corp., Tokyo (JP); TTPCOM Limited, Melbourn (GB)

( * ) Notice: Subject to any disclaimer, the term of this patent is extended or adjusted under 35 U.S.C. 154(b) by 76 days.

(21) Appl. No.: 11/797,349

(22) Filed: May 2, 2007

(65) Prior Publication Data
US 2007/0201580 A1      Aug. 30, 2007

Related U.S. Application Data

(63) Continuation of application No. 10/372,980, filed on Feb. 26, 2003, now Pat. No. 7,230,997.

(30) Foreign Application Priority Data
May 31, 2002    (GB)    ................ 0212723.1

(51) Int. Cl.
*H04L 25/03*    (2006.01)
(52) U.S. Cl. ..................................... 375/297
(58) Field of Classification Search ............... 375/296, 375/297, 300, 302; 332/144, 145, 149; 455/126, 455/127.1, 127.2, 102, 108, 110
See application file for complete search history.

(56) References Cited

U.S. PATENT DOCUMENTS

| | | | |
|---|---|---|---|
| 4,571,549 A | 2/1986 | Lods et al. | |
| 5,091,706 A | 2/1992 | Lautzenhiser | |
| 5,101,506 A | 3/1992 | Walls | |
| 5,430,416 A | 7/1995 | Black et al. | |
| 5,802,450 A | 9/1998 | Horton | |
| 5,910,753 A | 6/1999 | Bogdan | |
| 6,018,275 A | 1/2000 | Perrett et al. | |
| 6,147,553 A | 11/2000 | Kolanek | |
| 6,215,362 B1 | 4/2001 | Feng et al. | |
| 6,404,291 B1 | 6/2002 | Riley | |

(Continued)

FOREIGN PATENT DOCUMENTS

DE         10056472         11/2000

(Continued)

OTHER PUBLICATIONS

"High Linearity RF Amplifier Design", Artech House, 1979, P. Kenington, p. 162.

*Primary Examiner*—Don N Vo
(74) *Attorney, Agent, or Firm*—Mattingly, Stanger, Malur & Brundidge, PC (57) ABSTRACT

In a polar loop based radio-communications apparatus having a phase control loop for controlling the phase of a carrier outputted from an oscillator for transmission, and an amplitude control loop for controlling the amplitude of a transmission output signal outputted from a power amplification circuit, the phase control loop is first started while maintaining the amplitude control loop in an off state at the outset of transmission, and the amplitude control loop is started after stabilizing the phase control loop.

4 Claims, 10 Drawing Sheets

U.S. PATENT DOCUMENTS

| | | |
|---|---|---|
| 6,424,230 B1 | 7/2002 | Kocaman et al. |
| 6,671,337 B1 | 12/2003 | Cordoba |
| 6,750,719 B2 | 6/2004 | Toyota et al. |
| 6,865,235 B2 | 3/2005 | Khoini-Poorfard |
| 2002/0080716 A1 | 6/2002 | Asam et al. |
| 2004/0105502 A1 | 6/2004 | Bengtson |
| 2005/0176388 A1* | 8/2005 | Yamawaki et al. .......... 455/126 |
| 2008/0024227 A1* | 1/2008 | Toyota et al. ............... 330/285 |

FOREIGN PATENT DOCUMENTS

| | | |
|---|---|---|
| EP | 0339605 | 4/1989 |
| EP | 0457749 | 11/1991 |
| EP | 0535669 | 1/1992 |
| EP | 0731556 | 9/1996 |
| EP | 0786864 | 7/1997 |
| EP | 0788236 | 8/1997 |
| EP | 0797298 | 9/1997 |
| EP | 1115205 | 7/2001 |
| EP | 1211801 | 11/2001 |
| GB | 2237157 | 4/1991 |
| GB | 2291754 | 12/1994 |
| GB | 2369941 | 6/2002 |
| JP | 3209994 | 9/1991 |
| JP | 4372246 | 12/1992 |
| JP | 11355139 | 12/1999 |
| JP | 2000/244341 | 9/2000 |
| SU | 756603 | 8/1980 |
| WO | 01/41296 | 6/2001 |
| WO | 02/37666 | 5/2002 |

* cited by examiner

SEMICONDUCTOR INTEGRATED CIRCUIT FOR COMMUNICATION, RADIO-COMMUNICATION APPARATUS, AND TRANSMISSION STARTING METHOD

This is a continuation application of U.S. Ser. No. 10/372,980, filed Feb. 26, 2003 now U.S. Pat. No. 7,230,997.

CROSS-REFERENCE TO RELATED APPLICATION

The present application relates to subject matters described in the U.S. patent applications being file based on the United Kingdom Patent Applications No. 0212737.1 filed on May 31, 2002, No. 0212725.6 filed on May 31, 2002, No. 0212729.8 filed on May 31, 2002, No. 0212735.5 filed on May 31, 2002, and No. 0212732.2 filed on May 31, 2002. All of those U.S. applications are assigned to the same assignees of the present application.

BACKGROUND OF THE INVENTION

The present invention relates to techniques for improving the controllability of output power of a high frequency power amplification circuit by a power control signal and for ramping up without fail the output power of the high frequency power amplification circuit upon starting, and more particularly, to techniques suitable for application in a semiconductor integrated circuit for communication which contains a phase detection circuit and an amplitude detection circuit, and a radio-communications apparatus such as a portable telephone which incorporates the semiconductor integrated circuit for communication.

One of conventional schemes for radio-communications apparatus (mobile communication apparatus) such as a portable telephone is GSM (Global System for Mobile Communication) which is employed in Europe. This GSM scheme uses a phase modulation mode called GMSK (Gaussian Minimum Shift Keying) which shifts the phase of a carrier in accordance with transmission data.

Generally, a high frequency power amplification circuit is incorporated in a transmission output unit in a radio-communications apparatus. A conventional GSM-based radio-communications apparatus employs a configuration for controlling a bias voltage of a high frequency power amplification circuit to provide output power required for a call by means of a control voltage outputted from a circuit, called an APC (Automatic Power Control) circuit, which generates a control signal for a transmission output based on a signal from a detector for detecting a transmission output and a level required for transmission from a baseband LSI.

In recent portable telephones, an EDGE (Enhanced Data Rates for GMS Evolution) scheme has been proposed. The EDGE scheme has dual-mode communication functions, and relies on GMSK modulation to perform audio signal communications and on 3π/8 rotating 8-PSK (Phase Shift Keying) modulation to perform data communication. The 8-PSK modulation is such modulation that adds an extra amplitude shift to a phase shift of a carrier in the GMSK modulation. Since the 8-PSK modulation can send 3-bit information per symbol, in contrast with the GMSK modulation which sends 1-bit information per symbol, the EDGE scheme can achieve communications at a higher transmission rate as compared with the GSM scheme.

As one implementation of a modulation mode for imparting information on a phase component and an amplitude component, respectively, of a transmission signal, there is a conventionally known configuration called "polar loop" which involves separating a signal intended for transmission into a phase component and an amplitude component, subsequently applying feedback to the separated components through a phase control loop and an amplitude control loop, and combining the resulting components by an amplifier for outputting the combined components (for example, "High Linearity RE Amplifier Design" by Kenington, Peter B., p 162, published by ARTECH HOUSE, INC. in 1979).

A GSM-based communication system is only required to output a phase modulated signal in accordance with a required output level, so that a high frequency power amplification circuit at a final stage can be operated in a saturation region, whereas a radio-communications system capable of transmission/reception in the 8-PSK modulation mode must perform an amplitude control, so that a high frequency power amplification circuit at a final stage must be linearly operated in a non-saturation region. However, with a method of driving a high frequency power amplification circuit used in a conventional GSM-based communication system, it is difficult to ensure the linearity which is required by the high frequency power amplification circuit in a small output level region. On the other hand, the polar loop configuration can advantageously satisfy the requirement for the linearity of the high frequency power amplification circuit, and improve the power efficiency in the low output level region.

The GSM-based communication system is only required to output a phase modulated signal in accordance with a required output level, so that a high frequency power amplification circuit at a final stage can be operated in a saturation region, whereas a radio-communications system capable of EDGE-based transmission/reception must perform an amplitude control, so that a high frequency power amplification circuit at a final stage must be linearly operated in a non-saturation region. However, with a method of driving a high frequency power amplification circuit used in a conventional GSM-based communication system, it is difficult to ensure the linearity which is required by the high frequency power amplification circuit in a small output level region. On the other hand, the polar loop configuration can advantageously satisfy the requirement for the linearity of the high frequency power amplification circuit, and improve the power efficiency in the low output level region.

SUMMARY OF THE INVENTION

In this regard, the present inventors considered the employment of the polar loop configuration in an EDGE-based radio-communications system. As a result, while a prescription is given for portable telephone terminals supporting EDGE or GSM to increase output power POUT of an output power amplifier to a power threshold within a fixed time upon starting transmission, it was found that the polar loop configuration suffers from difficulties in ramping up the output power within the prescribed time.

It is an object of the present invention to provide a radio-communications apparatus, such as a portable telephone having a function of performing phase modulation and amplitude modulation, which is capable of increasing the output power of an output power amplifier to a predetermined level without fail within a prescribed time upon starting transmission.

It is another object of the present invention to provide a highly flexible radio-communications apparatus, such as a portable telephone having a function of performing phase modulation and amplitude modulation, which is capable of increasing the output power of an output power amplifier to a predetermined level without fail within a prescribed time for each operation mode upon starting transmission only by simply changing a value which is set in a register, even when a system is configured to have the ability to operate in a plurality of modes, such as a mode in which the phase modulation and amplitude modulation are both performed, a mode in which the phase modulation is only performed without performing the amplitude modulation, and the like.

The aforementioned and other objects and novel features of the present invention will become apparent from the description of the specification and the accompanying drawings.

A representative one of inventions disclosed in the present application will be briefly summarized as follows.

Specifically, in a polar loop based radio-communications apparatus having a phase control loop for controlling the phase of a carrier outputted from an oscillator for transmission, and an amplitude control loop for controlling the amplitude of a transmission output signal outputted from a power amplification circuit, the phase control loop is first started while maintaining the amplitude control loop in an off state, and the amplitude control loop is started after stabilization of the phase control loop. An output power amplifier does not guarantee a stable amplitude loop in the region where the output control voltage is very small, because the gain of the power amplifier is low at low output control voltage, making it very difficult for the loop to settle in a short time. However, according to the present invention, since the phase control loop is first stabilized before the amplitude control loop is started, the amplitude control loop is stabilized in a shorter time than when the amplitude control loop is started from a very low output power level immediately after the phase control loop has stabilized, thereby making it possible to increase the output power of the output power amplifier to a predetermined level within a prescribed time without fail.

DESCRIPTION OF THE EMBODIMENTS

Figure 1:
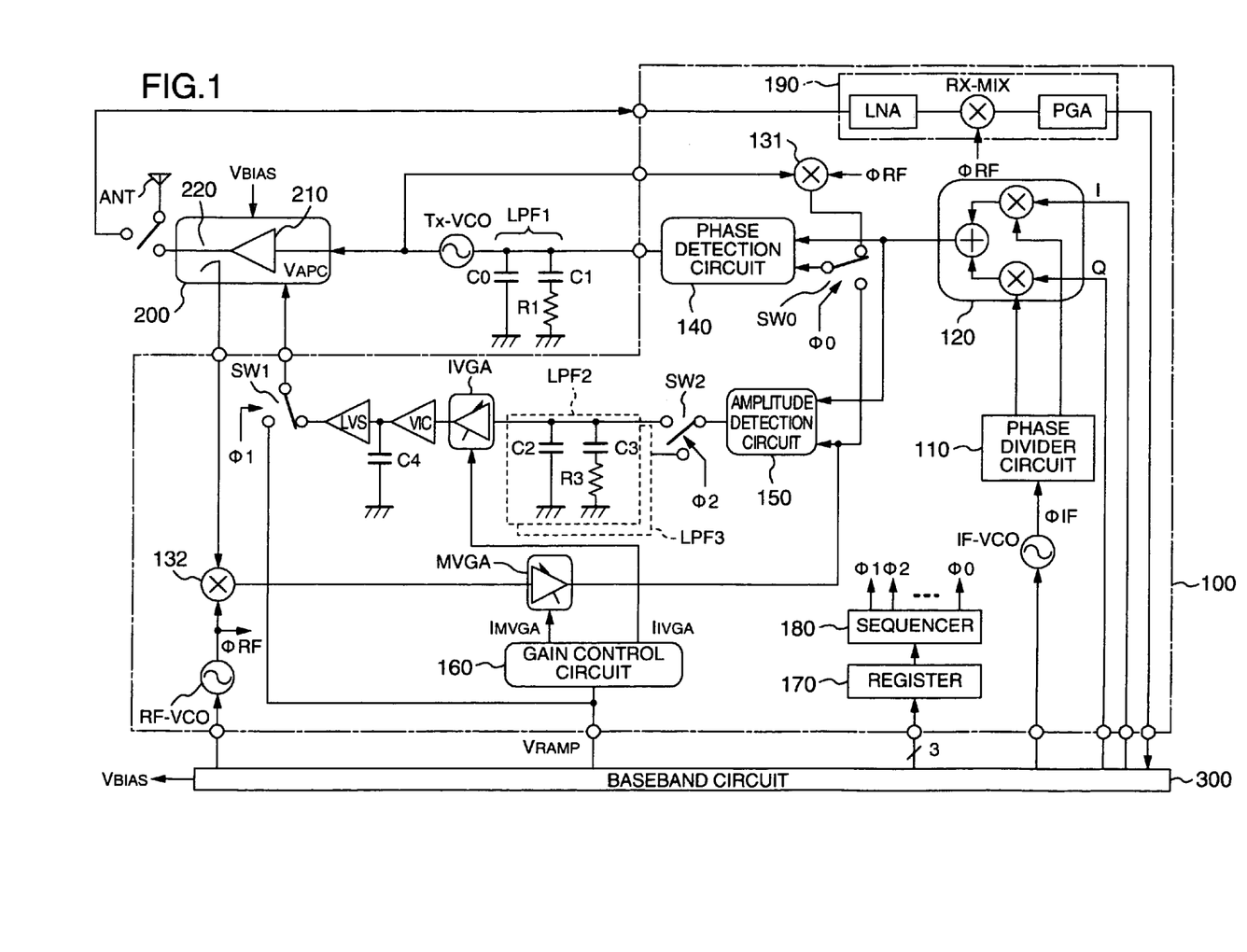
FIG. 1 is a block diagram illustrating the general configuration of a polar loop based transmitter circuit according to one embodiment of the present invention, and an exemplary configuration of a radio-communications system using the same.

FIG. 1 illustrates the general configuration a polar loop based radio-communications apparatus according one embodiment of the present invention. In FIG. 1, the polar loop based radio-communications apparatus comprises a high frequency IC 100 which is capable of performing the GMSK modulation in a GSM system, and the 8-PSK modulation in an EDGE system; a power module 200 which includes a high frequency power amplification circuit (hereinafter called the power amplifier) 210 for driving an antenna ANT for transmission, a coupler 220 for detecting transmission power, and the like; a baseband circuit 300 for generating I/Q signals based on transmission data (baseband signal), and generating a control signal for the high frequency IC 100 and a bias voltage VBIAS for the power amplifier 210 in the power module 200; an oscillator for transmission TxVCO for generating a phase modulated transmission signal (carrier); and a loop filter LPF1 for limiting the bandwidth of a phase loop.

The high frequency IC 100 is implemented as a semiconductor integrated circuit on a single semiconductor chip. The high frequency IC 100 is formed on the chip with a reception-related circuit 190 comprising a low noise amplifier (LNA); a mixer (Rx-MIX) for directly downconverting a received signal to an intermediate frequency signal; a high gain programmable gain amplifier (PGA); and the like, in addition to transmission-related circuits, as described below in detail. The high frequency IC 100, oscillator for transmission TxVCO, loop filter LPF, and the like may be mounted on a single insulating substrate such as a ceramic substrate to form a module.

A polar loop according to this embodiment comprises two control loops, i.e., an additional feedback loop for an amplitude control (hereinafter called the "amplitude loop"), other than a feedback loop for a phase control (hereinafter called the "phase loop"). Only when the EDGE mode is required is the phase information taking the same feedback path as the amplitude loop.

The foregoing high frequency IC 100 of the embodiment, which constitutes a polar loop, comprises a phase divider circuit 110 for generating a signal, the phase of which is shifted by 90° from an oscillating signal φIF at an intermediate frequency generated by an oscillator IF-VCO; a quadrature modulation circuit 120 for mixing I/Q signals supplied from the baseband LSI 300 with the signal divided by the phase divider circuit 110 for quadrature modulation; a mixer 131 for mixing a feedback signal from the oscillator for transmission TxVCO with an oscillating signal □RF from a high frequency oscillator RF-VCO for downconversion to a signal such as 80 MHz; a phase detection circuit 140 for detecting a difference in phase between an output signal of the mixer 131 and an output signal of the quadrature modulation circuit 120; a mixer 132 for mixing a detection signal from the coupler 220 for detecting an output level of the power amplifier 210 with the oscillating signal ϕRF from a high frequency oscillator RF-VCO; a feedback variable gain amplification circuit MVGA for amplifying an output of the mixer 132; an amplitude detection circuit 150 for comparing the amplified signal with the output signal of the quadrature modulation circuit 120 to detect an amplitude difference; a two section loop filter LPF2 for generating a voltage in accordance with an output of the amplitude detection circuit 150 and for limiting a frequency bandwidth of an amplitude loop; a forward variable gain amplification circuit IVGA for amplifying an output of the loop filter LPF2; a gain control circuit 160 for controlling the gains of the variable gain amplification circuit MVGA and IVGA; a register 170 for setting control information, operation mode and the like within the chip; a sequencer 180 for outputting a timing signal for each of the circuits within the chip based on values set in the register 170 to operate the circuit in a predetermined order in accordance with an operation mode; and the like.

In this embodiment, a phase loop is formed by the phase detection circuit 140—loop filter LPF1—oscillator for transmission TxVCO—mixer 131—phase detection circuit 140. Specifically, if there is a phase difference between an output signal of the quadrature modulation circuit 120 and a feedback signal from the mixer 131, a voltage for reducing the phase difference is supplied to a frequency control terminal of the oscillator for transmission TxVCO, such that the phase of the feedback signal from the mixer 131 matches with the phase of the output signal of the quadrature modulation circuit 120. This phase loop performs such a control that prevents the phase of the output of the oscillator for transmission TxVCO from shifting due to fluctuations in power supply voltage and a change in temperature.

The oscillator for transmission TxVCO has a constant amplitude. The loop filter LPF1 on the phase loop is composed of capacitors C0, C1, and a resistor R1 connected in series with C1. The values for the respective capacitors and resistor are determined such that the frequency bandwidth of the loop filter LPF1 is defined in a 1.2 MHz frequency bandwidth for reducing a larger amount of noise in consideration of an GMSK modulation mode which performs only phase modulation.

Further, in this embodiment, an amplitude loop is formed by the coupler 220—mixer 132—variable gain amplification circuit MVGA—amplitude detection circuit 150—loop filter LPF2—variable gain amplification circuit IVGA—power amplifier 210. After IVGA, there are a VIC (voltage to current converter), a capacitor C1 and a level shifter LVS, followed by the switch SW1. The loop filter LPF2 on the amplitude loop should have a low open-loop frequency bandwidth from a viewpoint of loop stability and noise reduction, whereas it should have a wide loop bandwidth for improving the accuracy of amplitude modulation (EVM) to provide good spectrum regrowth. From the foregoing aspect, this embodiment employs a filter which is composed of capacitors C4, C2, C3, and a resistor R3 connected in series with C3, and has two poles near 7 KHz, one pole near 10 MHz, respectively, and a zero point near 0.3 MHz in order to set the open loop frequency bandwidth of the amplitude loop at a position spaced by approximately 1.80 MHz from a transmission frequency.

While an amplitude loop including the higher-order loop filter LPF2 having two low frequency poles, one zero point, and a high frequency pole as described above provides for a highly accurate amplitude control, it does not ensure the stability for the loop due to a reduced phase margin. To address this disadvantage, this embodiment additionally comprises a lower-order filter LPF3 having only one pole and a switch SW2 other than the loop filter LPF2, as illustrated in FIG. 1, such that the switch SW2 is switched to the filter LPF2 when a highly accurate amplitude control is required, while the switch SW2 is switched to the filter LFP3 to provide a larger phase margin when no highly accurate amplitude control is required or when an increased stability is particularly desired for calibration purpose. The switch SW2 is switched by a control signal ϕ2 from the sequencer 180.

In the amplitude loop, the output of the power amplifier 210 is detected by the coupler 220, the detection signal of which is converted to an intermediate frequency bandwidth (IF) by the mixer 132, and amplified by the variable gain amplification circuit MVGA to generate a feedback signal SFB which is supplied to the amplitude detection circuit 150. Then, the amplitude detection circuit 150 compares a transmission signal modulated by the quadrature modulation circuit 120 with the feedback signal SFB to detect an amplitude difference which is then amplified by the variable gain amplification circuit IVGA, and applied to an output control terminal of the power amplifier 210 as a control voltage VAPC for performing an amplitude control.

In this embodiment, the gains of the variable gain amplification circuits MVGA, IVGA are controlled by the gain control circuit 160 in a reverse direction in accordance with a control voltage VRAMP from the baseband LSI 300 such that the sum of their gains is substantially constant. This control is performed by the following reason. As the open loop gain must be kept constant for maintaining a constant frequency bandwidth for the amplitude loop, when the amplitude loop is used to control the output power of the power amplifier 210, a change in the gain of the variable gain amplification circuit MVGA on the feedback path causes a change in the gain in the amplitude loop, resulting in a reduced phase margin and a lower stability of the loop.

In this embodiment, for controlling the output power of the power amplifier 210, when the gain of the variable gain amplification circuit MVGA on the feedback path is increased, the gain of the variable gain amplification circuit IVGA on the forward path is reduced on the contrary, and when the gain of the variable gain amplification circuit MVGA on the feedback path is reduced, the gain of the variable gain amplification circuit IVGA on the forward path is increased on the contrary. In this way, the open loop gain can be kept constant, so that the frequency bandwidth for the amplitude loop is kept constant as well. During this process, it is assumed that the gain of the power amplifier, i.e., the small signal gain $SSGA_{IN}=dPout/dVAPC$ is constant.

In an EDGE modulation mode, since the output of the power amplifier 210 includes both a phase modulation component and an amplitude modulation component, either the output of the oscillator for transmission TxVCO or the output of the power amplifier 210 may be used as a feedback signal to the phase detection circuit 140 which has an output phase component. However, since the output of the power amplifier 210 is very low when the power amplifier is powered on, the phase loop cannot be immediately locked by a feedback signal coming from the amplitude loop. On the other hand, in EDGE mode, since a feedback path of the amplitude loop is indispensable for both the amplitude and phase components, the amplitude loop must be used to provide feedback to the phase detector, resulting in such advantages as a highly accurate phase modulation. Additionally, the phase loop including the mixer 131 can be shut down after the phase loop is settled with the amplitude feedback path, resulting in a reduction in power consumption.

Thus, in this embodiment, a switch SW0 is provided for feeding the output of the variable gain amplification circuit MVGA back to the phase detection circuit 140, such that a path formed by the coupler 220 —mixer 132—variable gain amplitude circuit MVGA can be used as a feedback path common to the amplitude loop and phase loop. When the output power is raised up, the switch SW0 is switched to select a feedback signal from the phase loop, and then is switched again to select a feedback signal from the amplitude loop after the amplitude loop is stabilized. The switch SW0 is switched by a signal φ0 generated by the sequencer 180 by setting the register 170 from the baseband LSI 300.

Also, a portable telephone terminal which supports EDGE or GMSK controls a power amplifier to increase or reduce the output power POUT to a desired value within a fixed time. In a polar loop of this embodiment, this power control is performed to control the gain of the variable gain amplification circuit MVGA. Specifically, since a reduction in the gain of the variable gain amplification circuit MVGA results in a smaller feedback signal in the amplitude loop, the power amplifier 210 is controlled by the amplitude loop filter to increase the RF gain GPA (POUT/PIN), so that the feedback signal is kept at the same level as the reference signal from the modulation circuit 120, resulting in the increase of the output power POUT of the power amplifier 210. For reducing the output power POUT, the gain of the variable gain amplification circuit MVGA may be increased. In this embodiment, the gain of the variable gain amplification circuit MVGA is controlled by the control voltage VRAMP from the baseband LSI 300.

Together with the foregoing control, in this embodiment, the output voltage of level shifter LVS or the control voltage VRAMP from the baseband LSI 300 can be selectively supplied to control the power amplifier 210 by a switch SW1. Specifically, the power amplifier 210 is controlled by the control voltage from the amplitude loop in an 8-PSK modulation mode and in GMSK modulation mode at all power levels except the highest at which the central voltage VRAMP from the baseband LSI 300 is directly supplied to the power amplifier 210, in place of the control voltage from the amplitude loop. The switch SW1 is switched by a signal φ1 outputted from the sequencer 180.

As described above, since the polar loop can correctly control the phase and amplitude of the output of the power amplifier 210 by a common action of the phase loop and amplitude loop, this is suitable for a dual mode transmitter circuit which supports both GMSK and EDGE schemes. This is because the GMSK scheme which employs the constant amplitude modulation mode provides transmission information only in a phase component, whereas the EDGE scheme additionally provides information in an amplitude and phase component for increasing a transfer rate. Thus, a transmitter circuit which supports only the GMSK scheme conventionally performs such a control that provides a constant output amplitude of a power amplifier, so that the conventional transmitter circuit cannot support a scheme such as EDGE which involves a non-constant amplitude. Since the polar loop compares the feedback signal from the output of the power amplifier 210 with the non-constant of the output of the modulation circuit 120, the output of the power amplifier 210 is also an EDGE signal with a non-constant amplitude component. Additionally, the polar loop can also support the GMSK scheme which has no modulated amplitude component.

In either of the GMSK and EDGE schemes, however, the standard prescribes that the power must be bursted (ramp-up). Therefore, the output power must rise, vary and fall as specified by a predetermined power-time mask (see FIG. 6) at an antenna end, but it is relatively difficult to implement a circuit which satisfies the standard particularly in respect to the rising period. In the following, an embodiment which can satisfy the standard in this respect will be described in greater detail.

Figure 2:
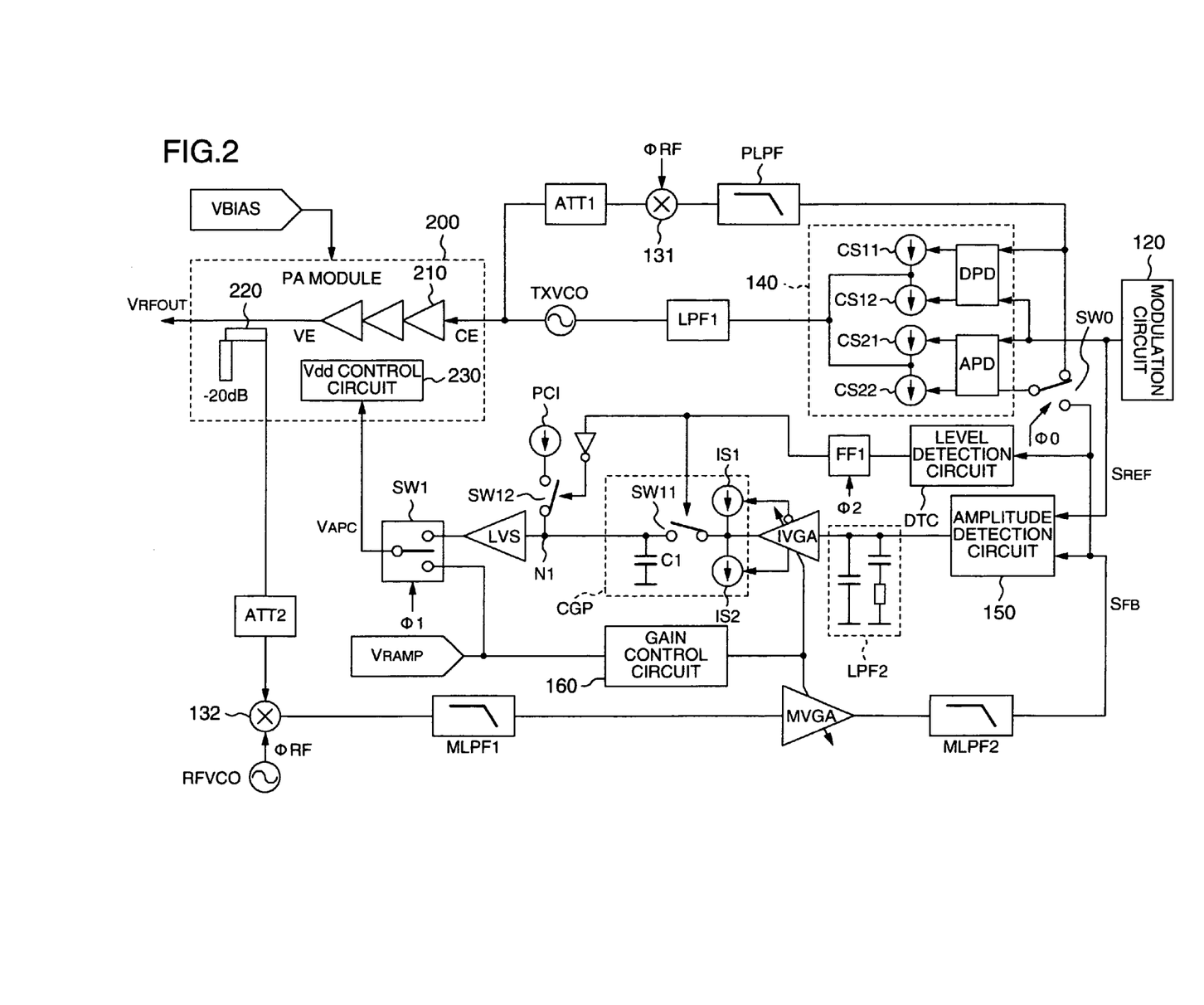
FIG. 2 is a block diagram illustrating an exemplary configuration of a polar loop in the transmitter circuit of FIG. 1 in greater detail.

FIG. 2 illustrates an exemplary configuration of a transmitter circuit which applies the polar loop configuration in greater detail. As illustrated in FIG. 2, the phase detection circuit 140 of this embodiment comprises a digital phase comparator DPD; an analog phase comparator APD; a pair of regulated current sources CS11, CS12 controlled by a differential output of the digital phase comparator DPD; and a pair of regulated current sources CS21, CS22 controlled by a differential output of the analog phase comparator APD. Upon starting transmission, the digital phase comparator DPD first performs a phase comparison, and then is switched to the analog phase comparator APD, so that the phase loop can be rapidly locked, as described later.

The regulated current sources CS11, CS12 controlled by the digital phase comparator DPD generate currents of equal magnitude, while the regulated current sources CS21, CS22 controlled by the analog phase comparator APD also generate currents of equal magnitude. As the loop filer LPF1 is successively shared by the digital phase comparator DPD and analog phase comparator APD, the currents of the regulated current sources CS11, CS12 controlled by the digital phase comparator DPD are preferably set approximately four times larger than the currents of the regulated current sources CS21, CS22 controlled by the analog phase comparator APD.

Charge pumps are formed by the regulated current sources CS11, CS12 and the capacitors C0, C1 of the loop filter LPF1, and by the regulated current sources CS21, CS22 and the capacitors C0, C1 of the loop filter LPF1, respectively. A voltage in accordance with a difference in phase between a modulated signal and a feedback signal detected by the digital phase comparator DPD or analog phase comparator circuit APD is charged on the capacitors C0, C1, causing the oscillator for transmission TxVCO to oscillate in accordance with the voltages charged across the capacitors C0, C1 to generate a signal having the phase which matches with that of a modulated signal outputted from the modulation circuit 120.

Though not shown in FIG. 1, the transmitter circuit of this embodiment comprises an attenuator ATT between the coupler 220 and mixer 132, forming part of the amplitude loop, for attenuating the output of the coupler 220 and supplying the mixer 132 with the attenuated output; and low pass filters MLPF1, MLPF2 between the mixer 132 and variable gain amplification circuit MVGA and between the variable gain amplification circuit MVGA and amplitude detection circuit 150, respectively, for removing unwanted waves and harmonics, as illustrated in FIG. 2.

Further, the transmitter circuit of this embodiment comprises, behind the variable gain amplification circuit IVGA, a charge pump CGP for charging or discharging depending on a differential output of the variable gain amplification circuit IVGA to generate a voltage in accordance with the output of the variable gain amplification circuit IVGA, and a level shift circuit LVS for shifting the voltage generated by the charge pump CGP by approximately 0.6 V in the negative direction. The charge pump CGP is comprised of a pair of current sources IS1, IS2, and a capacitor C4, and a switch SW11 is provided between the current sources IS1, IS2 and the capacitor C4 for shutting down the loop.

An output node N1 of the charge pump CGP is connected to a precharge current source PCI for precharging this node N1 through a switch SW12. The transmitter circuit of this embodiment further comprises a level detection circuit DTC for comparing a signal from the modulation circuit 120 with a feedback signal of the amplitude loop to detect whether or not the feedback signal reaches a predetermined level, and a flip-flop FF1 operated by an output signal of the level detection circuit DTC to generate an ON/OFF control signal for the switches SW11, SW12.

The level detection circuit DTC is configured such that its output signal changes to high level when the feedback signal reaches −5.9 dBm. The feedback signal at −5.9 dBm corresponds to the level of the feedback signal when the output control terminal (VAPC) of the power module 200 is at a level such as −11 dB. Generally, the switch SW11 is turned on while the switch SW12 is turned off to terminate a precharge when the level detection circuit DTC detects the arrival of the feedback signal to a predetermined level. However, if the feedback signal does not reach the predetermined level even after the precharge has lasted for a predetermined time (for example, 5 μsec), the flip-flop FF1 is reset by a control signal φ2 from the sequencer 180 to forcedly terminate the precharge.

When an attempt is made to ramp up the output power of the output power amplifier 210 from a very low power level with the sole control of the amplitude loop closed, a long time is taken until the amplitude control loop is stabilized, resulting in difficulties in ramping up the output power within a prescribed time. On the other hand, the precharge is performed to increase rapidly the output power to a level at which the loop gain of the power amplitude becomes constant, thereby making it possible to increase the output power of the output power amplifier 210 to the predetermined transmit level within the prescribed time without fail upon starting transmission. The shift circuit LVS is provided because the charge pump CGP is not capable of providing 0 V due to the nature of the current source IS2, whereas the charge pump is required to have the ability to apply a control voltage up to 0 V to the output power module 200.

Figure 3:
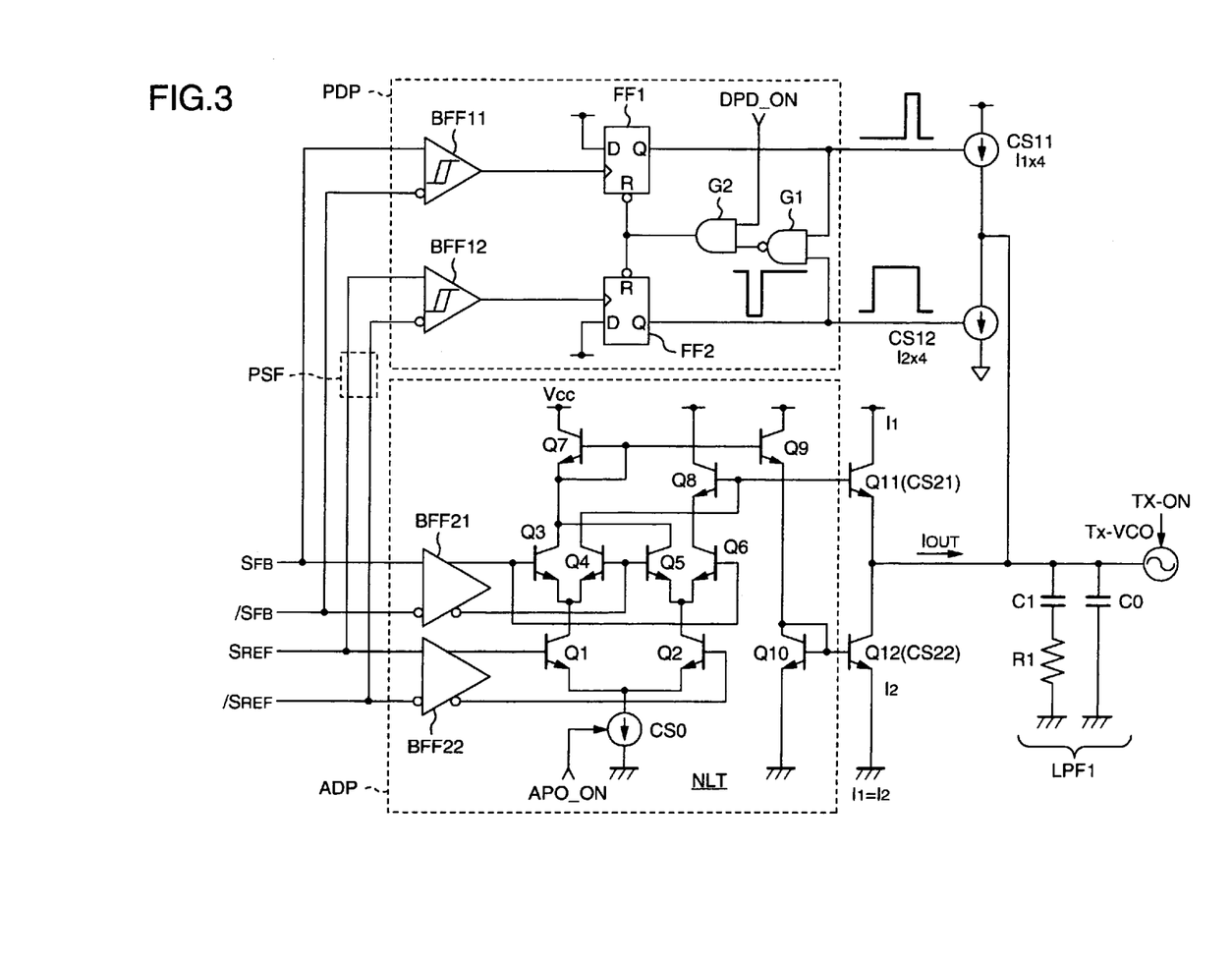
FIG. 3 is circuit diagram illustrating a specific example of a phase detection circuit for use in the embodiment of the present invention.

FIG. 3 illustrates a specific example of the phase detection circuit 140 which comprises the digital phase comparator DPD and analog phase comparator APD.

The digital phase comparator DPD comprises differential inputs—single output buffers BFF11, BFF12, each of which receives differential input signals SFB, /SFB and reference signals SREF, /SREF; D-type flip-flops FF1, FF2 which operate as latches by the buffers BFF11, BFF12; a NAND gate G1 which receives outputs of the flip-flop FF1, FF2; and an AND gate G2 which receives an output of the NAND gate G1 and an activation signal DPD_ON. The buffers BFF11, BFF12 are desirably those circuits which have a function of a limiter for shaping the waveform of the sinusoidal input signals to output the shaped signals as square-wave signals. The digital phase comparator DPD starts a phase comparison operation as the activation signal DPD_ON goes to high level. As the outputs of the buffers BFF11, BFF12 rise, the flop-flops FF1, FF2 operate as latches to provide outputs at high level. As both outputs of the two flip-flops FF1, FF2 go to high level, the flop-flops FF1, FF2 are reset through the NAND gate G1.

As a result, one of the flop-flops FF1, FF2, which advances in phase, generates an output pulse, the pulse width of which is larger than an other output pulse of the other flip flop, causing a current of the current source CS11 or CS12 to flow extra by the difference in pulse width. This extra current causes a change in a voltage charged across the capacitors C0, C1 of the loop filter LPF1 and a resulting change in the control voltage supplied to the oscillator for transmission TxVCO to advance or retard the phase of the output. At the time the input signal SFB matches with the reference signal SREF in phase, a charge current of the current source CS11 is in balance with a discharge current of the current source CS12 to provide constant voltages charged on the capacitors C0, C1 of the loop filter LPF1, resulting in a locked state.

Figure 4:
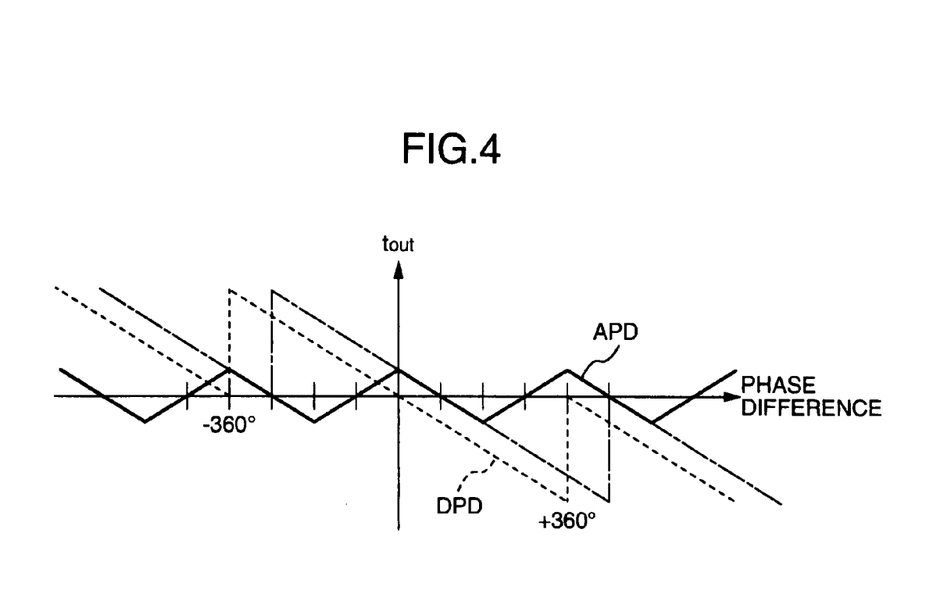
FIG. 4 is a graph showing a relationship between a phase difference of input signals and an output current in the phase detection circuit of FIG. 3.

In this event, the digital phase comparator DPD generates an output current Iout at "0" when the phase difference is at −360°, 0°, +360° to enter the loop into the locked state, as indicated by a broken line in FIG. 4. As is apparent from a comparison of the broken line with a solid line which indicates the waveform of an output current of the analog phase comparator APD, the digital phase comparator DPD has a phase draw range over 720°, which is much wider than that of the analog phase comparator APD over 180°. In addition, since the digital phase comparator DPD has only one point at which the loop enters the locked state, an image lock is unlikely to occur. Thus, rapid phase drawing (8 μsec or shorter) can be accomplished by first drawing the phase of the loop by the digital phase comparator DPD.

However, as described above, the digital phase comparator DPD is disadvantageous in that spurious noise is introduced into the output of the oscillator for transmission TxVCO due to a pass current which is generated by a charge current of the current source CS11 and a discharge current of the current source CS12 at the time the input signal SFB matches with the reference signal SREF in phase. Thus, by switching the digital phase comparator DPD to the analog phase comparator APD by the control signals DPD_ON, APD_ON after the phase is locked by the digital phase comparator DPD, a lock-up time can be reduced while avoiding the occurrence of noise upon transmission and reception. The control signals DPD_ON, APD_ON can be provided from the sequencer 180 in FIG. 1.

The analog phase comparator APD comprises differential input—differential output buffers BFF21, BFF22, each of which receives differential input signals SFB, /SFB and reference signals SREF, /SREF; and a multiplier circuit MLT which receives outputs of the buffers BFF21, BFF22.

The multiplier circuit MLT is composed of a differential pair of transistors Q1, Q2 which receive a differential output of the buffer BFF22 at their bases; a regulated current source CS0 connected to a common emitter of Q1, Q2; a differential pair of transistors Q3, Q4 which have a common emitter connected to a collector of Q1, and receive a differential output of the buffer BFF21 at their bases; a differential pair of transistors Q5, Q6 which have a common emitter connected to a collector of Q2 and receive the differential output of the buffer BFF21 at their bases; a transistor Q7 connected between a collector of Q3 and a power supply voltage Vcc; a transistor Q8 connected between a collector of Q6 and the power supply voltage Vcc; a transistor Q9 connected in current mirror configuration with the transistor Q7; and a transistor Q10 connected in series with Q9. Then, the transistor Q8 and the transistor Q11 acting as the regulated current source CS21 of the charge pump are connected in current mirror configuration. The transistor Q10 and the transistor Q12 acting as the regulated current source CS22 of the charge pump are likewise connected in current mirror configuration.

The analog phase comparator APD is activated as the regulated current source CS0 is turned on by the control signal APD_ON to start a comparison in phase between the input signal SFB and reference signal SREF, and outputs a current Iout in accordance with the phase difference as indicated by a solid line in FIG. 4. As can be seen from a comparison between the output current characteristic (indicated by a solid line) of the analog phase comparator APD with the output current characteristic (indicated by a broken line) of the digital phase comparator DPD shown in FIG. 4, the phase is locked by the digital phase comparator DPD when the phase difference is zero, whereas the phase is locked by the analog phase comparator APD when the phase difference is ±90°.

For this reason, even if the digital phase comparator DPD is switched to the analog phase comparator APD after the phase of the loop is locked by the digital phase comparator, the analog phase comparator APD locks the phase (re-synchronized) with the phase shifted by 90° without fail after the switching. It should be noted that this re-synchronization generally takes 1 μsec or shorter, thus causing substantially no problem. As another concern, the control voltage supplied to the oscillator for transmission TxVCO may slightly fluctuate. Therefore, if the phase detection circuit 140 is affected by the time required for the re-synchronization and the fluctuations in the VCO control voltage, a phase shifter for shifting the phase by 90° may be provided at a location, for example, as indicated by a broken line PSF in FIG. 3 to shift the phase of the reference signals SREF, SREF inputted to the digital phase comparator DPD by 90°.

The provision of such a phase shifter shifts the output current characteristic of the digital phase comparator DPD, as indicated by a one-dot chain line in FIG. 4, to match the phase lock point in the digital phase comparator DPD with the phase lock point in the analog phase comparator APD to prevent a delay and fluctuations in the control voltage in the switching. The phase shifter may be provided at a location on the input side of the analog phase comparator APD rather than the input side of the digital phase comparator DPD.

Figure 5:
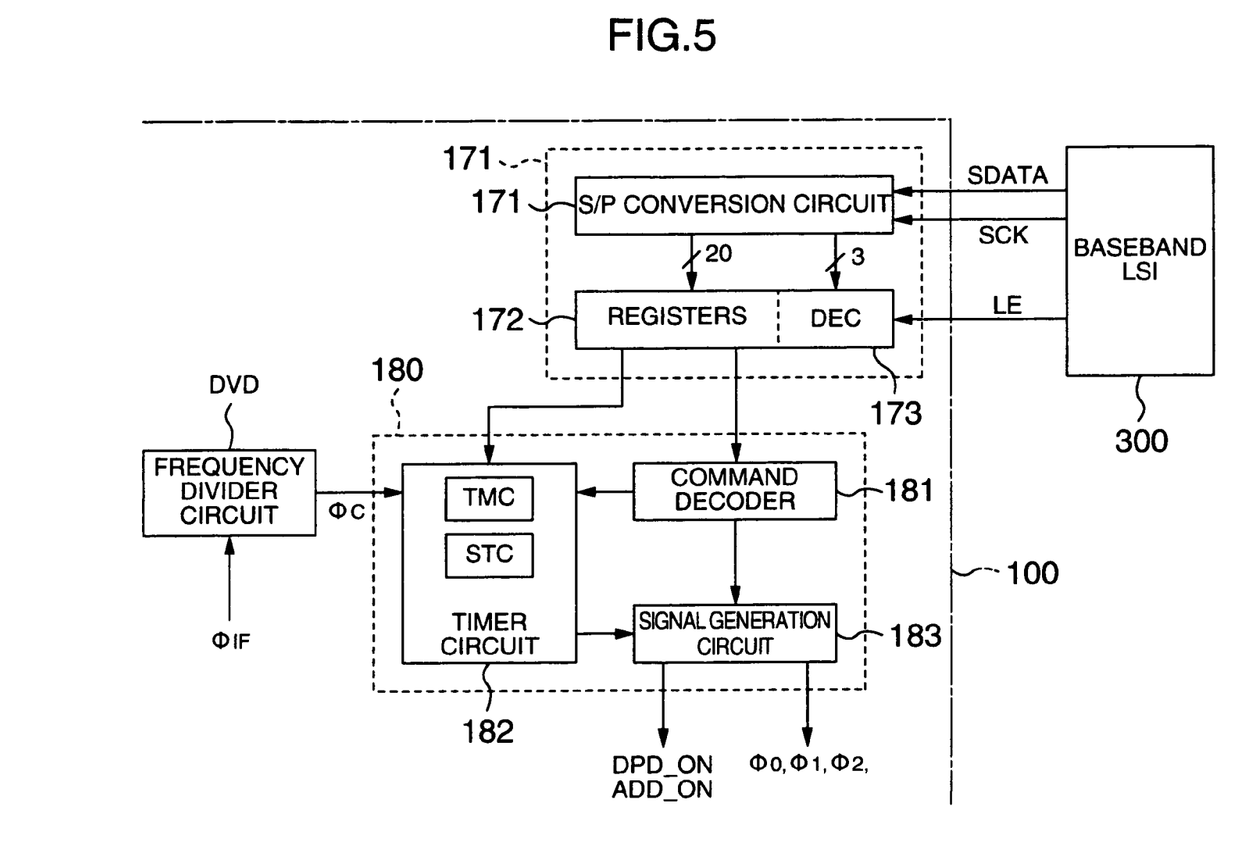
FIG. 5 is a circuit diagram illustrating an exemplary configuration of a sequencer in the embodiment of the present invention.

FIG. 5 illustrates an exemplary configuration of the register 170 and sequencer 180 for generating the control signals DPD_ON, APD_ON for controlling the phase detection circuit 140 within the transmitter circuit, and signals φ0, φ1, φ2 for controlling the switches SW0, SW1, SW11, SW12 and the like based on commands from the baseband LSI 300 and values set in the register 170 to ramp up the output power of the output power amplifier 210 for transmission.

The register 170 comprises a serial/parallel conversion circuit 171 for fetching serial data SDATA supplied from the baseband LSI 300, for example, in units of 23 bits in synchronism with a clock SCK supplied likewise from the baseband LSI 300 to convert the serial data SDATA to parallel data; a group of data registers 172 comprised of a plurality of registers for holding upper 20 bits of the data converted by the serial/parallel conversion circuit 171; a decoder circuit 173 for decoding the lower three bits of the data fetched into the serial/parallel conversion circuit 171 to generate a signal for specifying a register for holding the upper 20 bits of the data; and the like. The decoder 173 and registers 172 operate, respectively, in response to a load enable signal LE supplied from the baseband LSI 300.

The sequencer 180 in turn comprises a command decoder 181 for decoding a command code of data fetched into the registers 172 to generate an internal control signal; a timer circuit 182 for measuring the time for generating a timing signal in accordance with a command supplied from the baseband LSI 300; a signal generation circuit 183 for generating signals for controlling the transmitter circuit such as the control signal DPD_ON, APD_ON, φ0, φ1, φ2 and the like.

The timer circuit 182 comprises a timer counter TMC which operates as a counter in response to a clock φc generated by dividing the frequency of an oscillating signal within the high frequency IC 100 (for example, an oscillating signal φIF for modulation generated by the oscillator IF-VCO) by a frequency divider circuit DVD; and a step counter STC which starts counting up when the timer counter TMC times up. The command decoder 181 selects predetermined timing setting data from data stored in the registers 172 in accordance with a command inputted thereto and sets the selected data in each timer counter for start-up.

As the started timer counter TMC times up, the timer counter TMC is set to data of time which should be next measured by the timer counter TMC, and is restarted. As the timer counter TMC times up, the step counter STC counts up. The value (step number) of the step counter STC is supplied to the signal generation circuit 183, followed by a transition to the next step, where the signal generation circuit 183 generates and outputs an internal control signal, in accordance with the step number, which changes at a predetermined timing.

Figure 6:
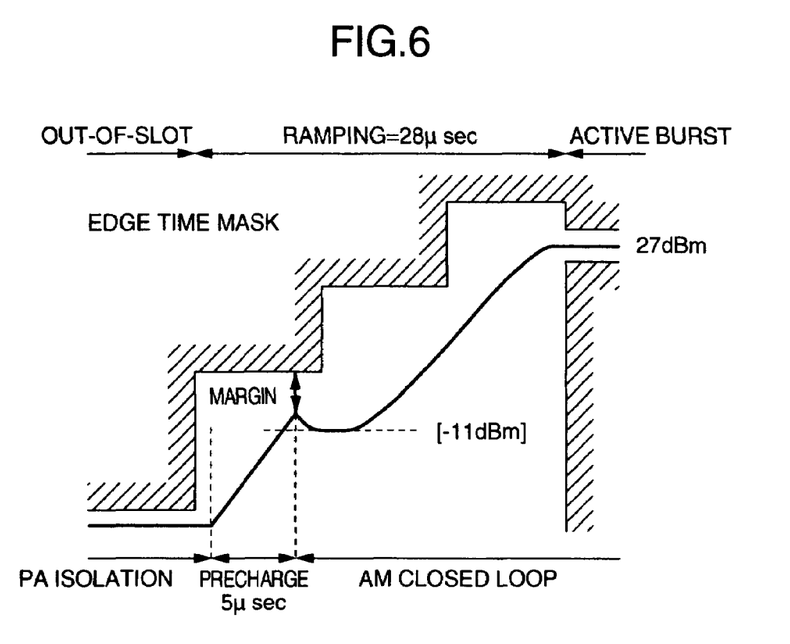
FIG. 6 is an explanatory diagram showing a relationship between a change in output level upon ramping up the output power from the polar loop based transmitter circuit according to an embodiment of the present invention and a time mask when a required output level, prescribed in the GSM system standard, is high.
Figure 7:
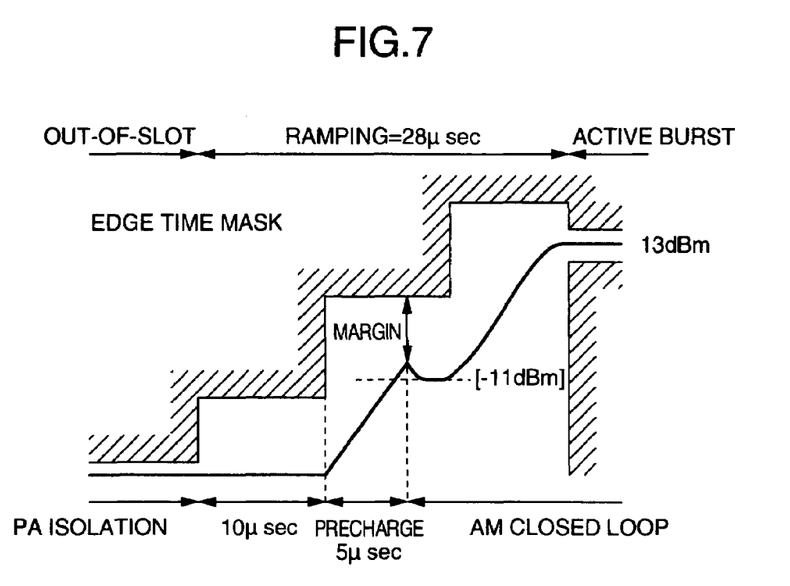
FIG. 7 is an explanatory diagram showing a relationship between a change in output level upon ramping up the output power from the polar loop based transmitter circuit according to an embodiment of the present invention and a time mask when a required output level, prescribed in the GSM system standard, is low.
Figure 8:
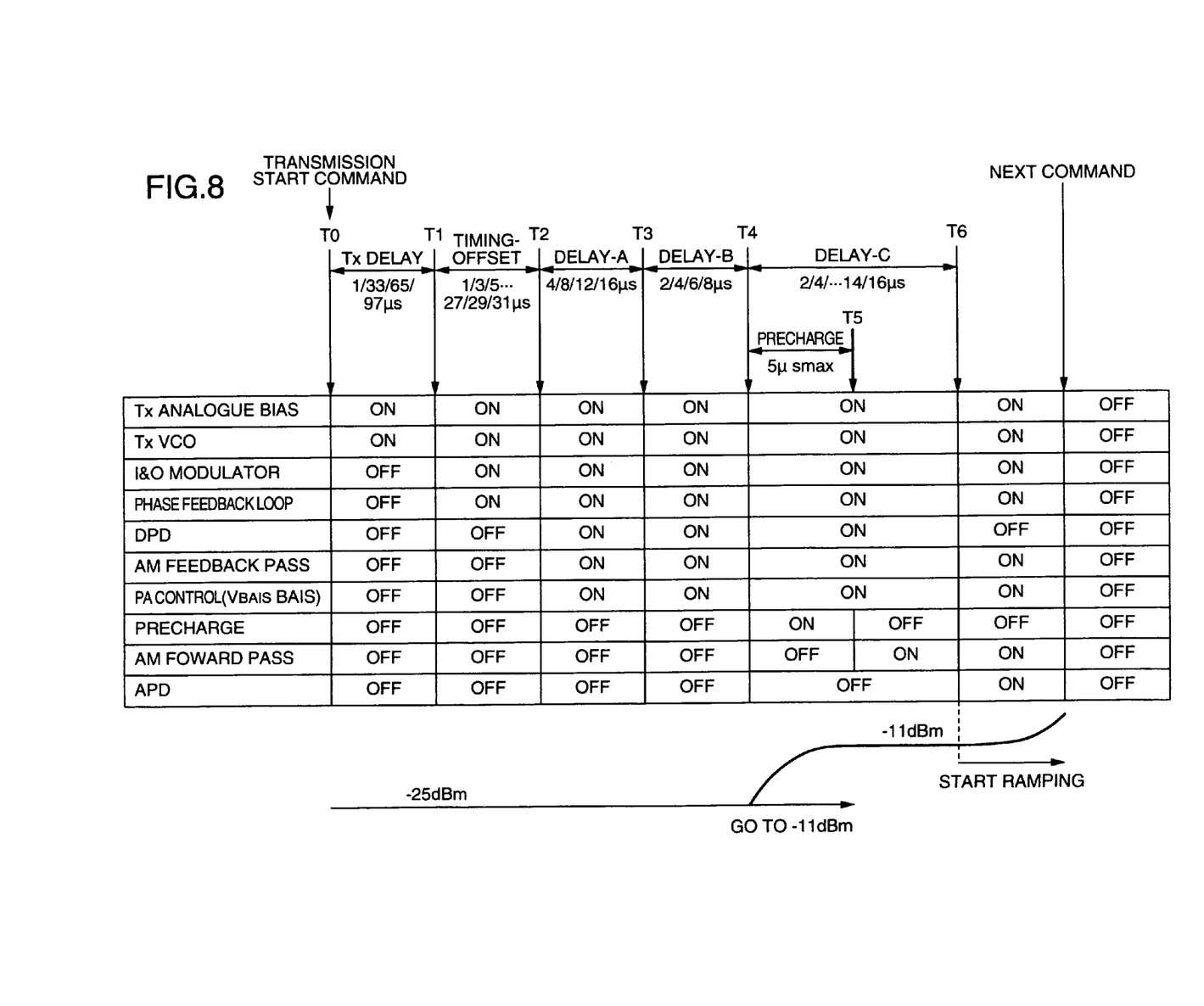
FIG. 8 is a time chart illustrating an operation procedure for ramping up the output power in an 8-PSK modulation mode performed by the transmitter circuit according to the embodiment of the present invention.

Referring next to FIGS. 6, 7, 8, description will be made on the output power ramp-up operation of the polar loop based transmitter circuit according to this embodiment for starting transmission in the EDGE modulation mode. FIGS. 6 and 7 show examples of a time mask which is defined by the standard of the EDGE system, and FIG. 8 is a time chart showing in time series the operation of each components in the transmitter circuit in the 8-PSK modulation mode. FIG. 6 shows a time mask and an associated ramp-up operation when a required output level is relatively high such as 27 dBm at a location relatively far from a base station, while FIG. 7 shows a time mask and an associated ramp-up operation when a required output level is relatively low such as 13 dBm at a location close to a base station.

In the operation for ramping up the output power, the oscillator for transmission TxVCO is first started to oscillate (period T0-T1 in FIG. 8). Since the oscillator for transmission TxVCO is directly started by the baseband LSI 300, the period T0-T1 is provided for the high frequency IC 100 to wait for the oscillator for transmission TxVCO to stably oscillate. At time T1, as the oscillator for transmission TxVCO is started, the baseband LSI 300 sends I, Q signals to the modulation circuit 120 to modulate an intermediate frequency signal φIF, supplies the modulated signal to the phase detection circuit 140 and amplitude detection circuit 150, and turns on the phase loop but not yet the phase detector (period T1-T2 in FIG. 8). In this way, a transmission signal of the oscillator for transmission TxVCO is downconverted by the mixer 131 and fed back to the phase detection circuit 140.

Next, at time T2, the digital phase comparator DPD is turned on to compare the phase of the feedback signal from the oscillator for transmission TxVCO with that of the modulated signal to start a control for matching the phases of the two signals with each other (period T2-T3 in FIG. 8). In this event, the amplitude detection circuit 150 also starts a comparison in amplitude between a detection signal inputted thereto from the coupler 220 through the feedback path with the modulated signal (however, a forward path of the amplitude loop is off). Also, the power module 200 starts a control in response to a bias voltage VBIAS supplied from the baseband LSI 300. Also, the capacitor C4 is precharged to 0.6 V, a voltage level that guarantees a maximum level of 100 mV at the VAPC input. Then, this state is held for a predetermined time to wait for the phase loop to be locked (period T3-T4 in FIG. 8).

Next, the flip-flop FF1 is reset by the control signal φ2 to turn off the switch SW11 on the forward path of the amplitude loop in response to the output of the flip-flop FF1 to open the loop, and to turn on the switch SW12 to start precharging the capacitor C4 of the charge pump by the current source PCI for precharge (at timing T4 in FIG. 8).

Subsequently, when the level detection circuit DTC determines that the modulated signal matches with the feedback signal from the amplitude loop in level, the flip-flop FF1 is operated as a latch by the level detection circuit DTC to change its output. The changed output turns off the switch SW12 to stop precharging the capacitor C4, and turns on the switch SW11 on the forward path to close the amplitude loop to start the amplitude control (at timing T5 in FIG. 8). Also, in this event, as a predetermined time (for example, 5 μsec) has elapsed before the flip-flop FF1 is operated as a latch by the level detection circuit DTC, the flip-flop FF1 is released from the reset state by the control signal φ2 from the sequencer 180 to forcedly terminate the precharge. This system prevents unlocking problems to happen and stops the precharge before it may become dangerous. In this way, the output of the power amplifier 210 is raised to such a level as −11 dBm, at which the amplitude loop may converge rapidly (T5-T6 period).

Subsequently, the output control voltage VRAMP is provided from the baseband LSI 300 shortly after T6 to ramp up the output power of the power module 200 to a desired level. At time T6, in the phase loop, the digital phase detector DPD is switched to the analog phase detector APD and settles very quickly.

In this embodiment, the foregoing operation in accordance with the time chart of FIG. 8 is automatically executed by the sequencer 180 by sending a transmission start command and setting data from the baseband LSI 300 to the register 170 of the high frequency IC 100. As a result, the output power of the power amplifier 210 can be raised up within a time mask prescribed in the EDGE scheme (nearly the same applies to the GMSK scheme). When the required output level is relatively low, the output power can be ramped up within the prescribed time mask by delaying the start of precharge by a predetermined time, for example, 10 μsec, as shown in FIG. 7. The operation for delaying the start of precharge by ten seconds may be executed, for example, by changing data set in the register 170 associated with the time between timings T1 and T2 in FIG. 8, measured by a timer.

Figure 9:
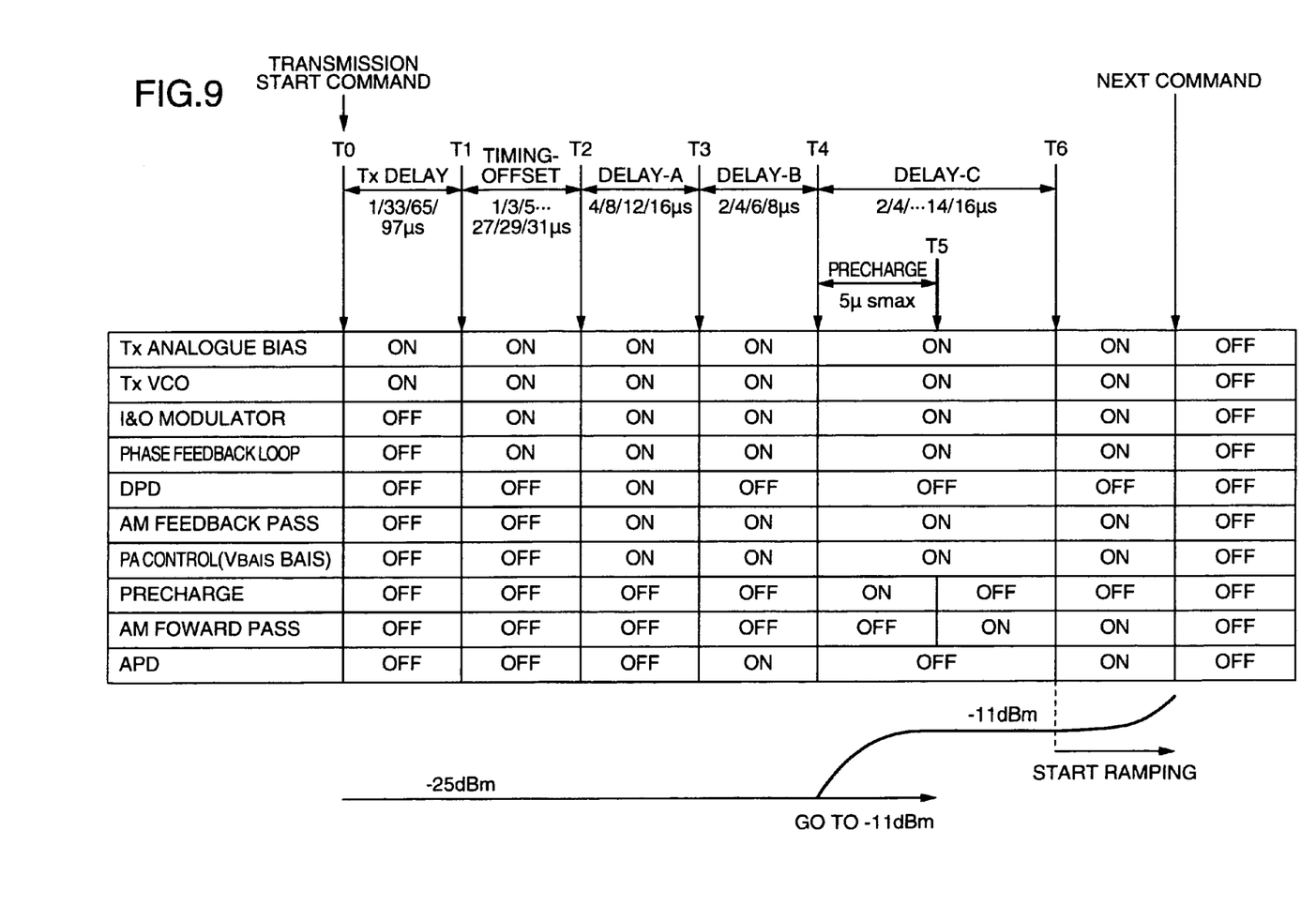
FIG. 9 is a time chart illustrating an operation procedure for ramping up the output power in a GMSK modulation mode when an amplitude loop is used in the transmitter circuit according to the embodiment of the present invention.

FIG. 9 illustrates an operation procedure for controlling the output power of the power amplifier 210 by generating a voltage VAPC for controlling the power module 200 based on the output control voltage VRAMP supplied from the baseband LSI 300 to the high frequency IC 100 utilizing the amplitude loop in the GMSK modulation mode in the transmitter circuit of this embodiment. The operation procedure in FIG. 9 differs from that in FIG. 8 only in that the digital phase detector DPD is switched to the analog phase detector APD at a different moment (T3 instead of T6).

Though not shown in FIG. 9, when the amplitude loop is utilized in the GMSK modulation mode, the switch SW2 on the amplitude loop is changed over to use the lower-order filter LPF3. The switching to the filter LPF3 provides a larger phase margin for the amplitude loop and more stability. This permits the switching from the aforementioned digital phase detector DPD to the analog phase detector APD at earlier timing.

Figure 10:
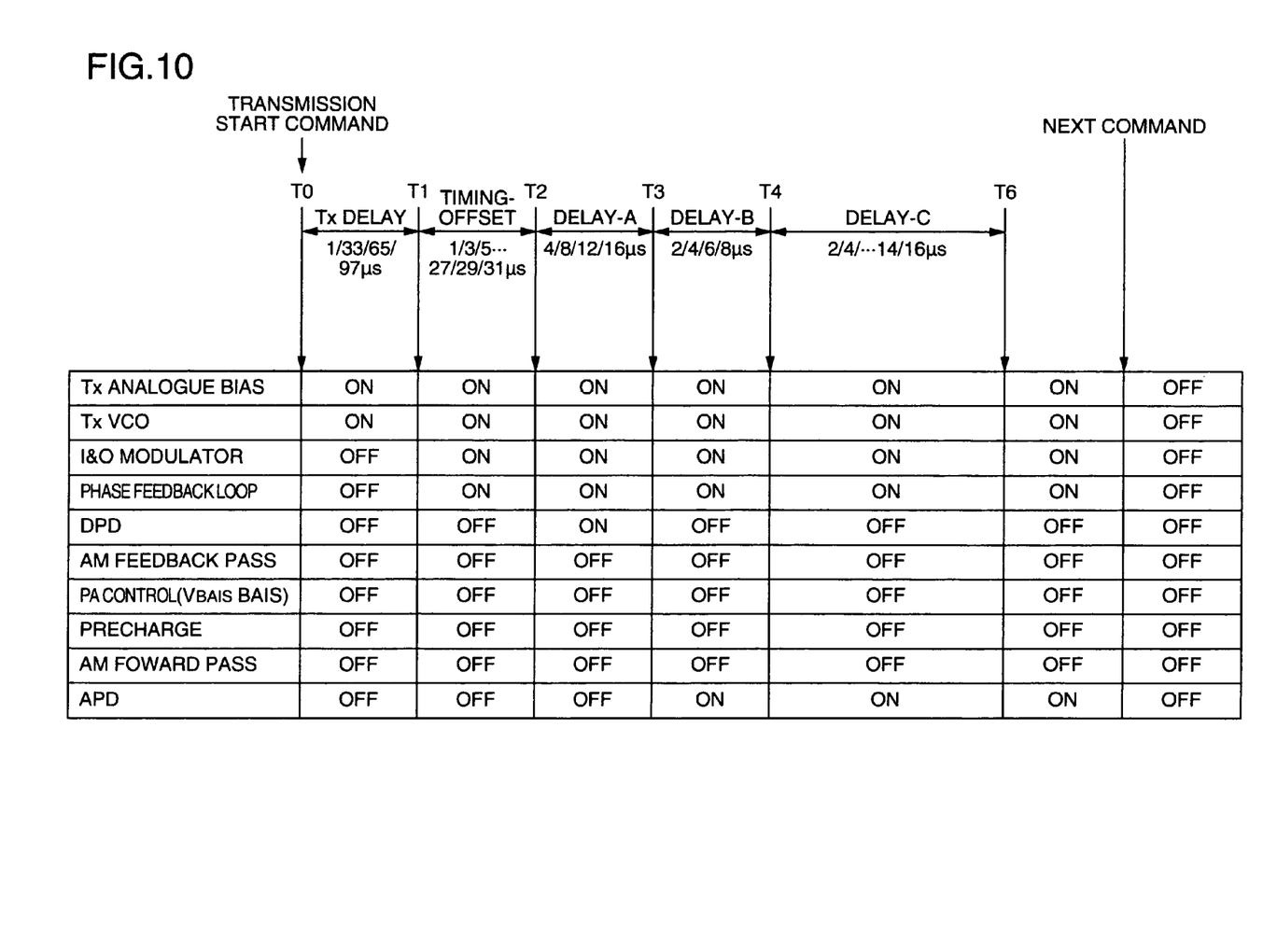
FIG. 10 is a time chart illustrating an operation procedure for ramping up the output power in a GMSK modulation mode when the amplitude loop is not used in the transmitter circuit according to the embodiment of the present invention.

FIG. 10 illustrates an operation procedure for controlling the output power of the power module 200 in the GMSK modulation mode, without utilizing the amplitude loop in the transmitter circuit of this embodiment. The VAPC signal is controlled by the voltage VRAMP for the baseband LSI 300.

The operation procedure in FIG. 10 differs from that in FIG. 9 in that the feedback path and forward path of the amplitude loop are continuously turned off since the amplitude loop is not used, and that no precharge is performed on the amplitude loop. In addition, the power module 200 may or may not be controlled by the bias voltage VBIAS. This is because a constant bias voltage VBIAS can be applied internally to the power module 200 when the amplitude loop is not utilized and as soon as the power amplifier is turned on.

In the transmitter circuit of this embodiment, the amplifier module 100 may eventually contain the output power control function which can support the GMSK modulation required by a GMSK system, and has been so far provided by an external IC in the conventional GMSK system. In addition, the high frequency IC 100 of this embodiment can be used as well in a conventional GMSK system having an APC circuit.

Finally, description will be made on a gain control for the variable gain amplification circuit IVGA on the forward path and the variable gain amplification circuit MVGA on the feedback path.

A portable telephone terminal which supports EDGE or GSM performs a power control for increasing or reducing the output power POUT of a power amplifier to a desired value within a fixed time. The polar loop performs this power control by controlling the gain of the variable gain amplification circuit MVGA. Specifically, since a reduction in the gain of the variable gain amplification circuit MVGA results in a reduced feedback signal of the amplitude loop, the power amplifier 210 is controlled to increase the gain GPA (POUT/ PIN), in order to match with the reference signal from the modulation circuit 120, to increase the output power POUT. For reducing the output power POUT, the gain of the variable gain amplification circuit MVGA may be increased. In this embodiment, the gain of the variable gain amplification circuit MVGA is controlled by the control voltage VRAMP from the baseband LSI 300. Moreover, the proportion of a reduction or an increase in the gain GMVGA of the variable gain amplification circuit MVGA is always made equal to the proportion of an increase or a reduction in the gain GPA of the power amplifier.

Figure 11A:
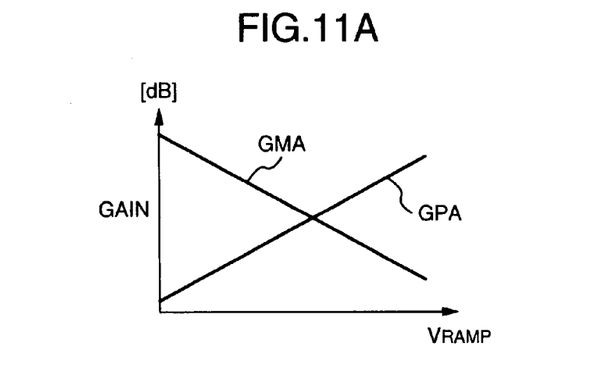
FIGS. 11A and 11B are graphs showing a relationship among an output control voltage VRAMP and the gains of an output power amplifier and a variable gain amplification circuit, and a relationship between the output control voltage VRAMP and the output power of the output power amplifier in the polar loop based transmitter circuit according to the present invention.
Figure 11B:
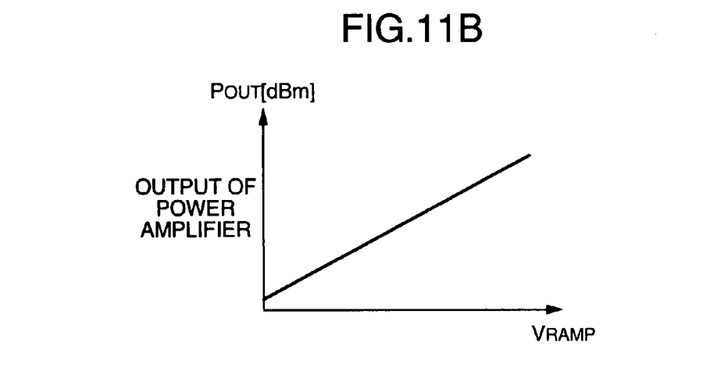

As a consequence of the foregoing control, a change in the gain of the variable gain amplification circuit MVGA with respect to the control voltage VRAMP exhibits a straight line descending to the right, as indicated by a solid line GMA in FIG. 11A, while a change in the gain of the power amplifier 210 with respect to the control voltage VRAMP exhibits a straight line ascending to the right, as indicated by a solid line GPA in FIG. 11A. Also, this causes the output power POUT of the power amplifier 210 to linearly increase with respect to the control voltage VRAMP, as shown in FIG. 11B. The output power POUT of the power amplifier 210 linearly controlled by the control voltage VRAMP in units of dB in this manner is effective for stably operating the amplitude loop.

On the other hand, the reference signal SREF from the modulation circuit 120, which is modulated in conformity to 8-PSK and has a varying amplitude component, is controlled by the action of the amplitude control loop such that an amplitude component of the output power POUT of the power amplifier 210 matches with the reference signal SREF. In this event, the output power POUT of the power amplifier 210 is locked to the reference signal by the aforementioned power control. In this way, the polar loop can maintain the desired output power without affecting the amplitude component modulated in conformity to 8-PSK or GMSK.

Figure 12:
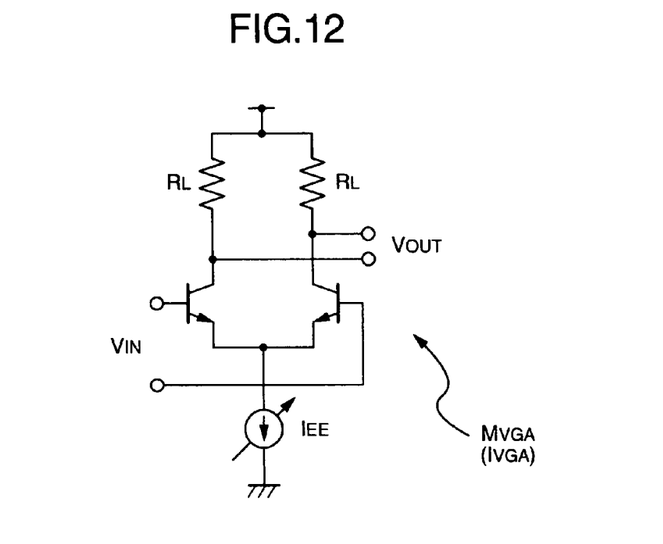
FIG. 12 is a circuit diagram illustrating a specific example of a variable gain amplification circuit for use in the embodiment of the present invention.

When the variable gain amplification circuit MVGA comprises a circuit, for example, as illustrated in FIG. 12, its bias current IEE may be exponentially changed to linearly change the gain with respect to the control voltage VRAMP.

While the invention made by the present inventors has been specifically described in connection with several embodiments, it should be understood that the present invention is not limited to the aforementioned embodiments but may be modified in various manner without departing from the spirit and scope of the invention. For example, in the foregoing embodiment, the oscillating signal φIF for modulation, generated by the oscillator IF-VCO is divided by the divider circuit DVD to generate the clock φc which is applied to the timer counter TMC, such that the timer counter TMC operates as a counter. Alternatively, the oscillating signal φRF generated by the oscillator RF-VCO may be divided by a divider circuit to generate a clock which may be used to operate the timer counter TMC. Further alternatively, a system clock supplied from the baseband LSI 300 may be used to operate the timer counter TMC. Also, while the foregoing embodiment has been described in connection with the control for circuits associated with transmission, the sequencer 180 can also generate control signals for circuits 190 associated with reception.

While the present invention has been described in connection with a dual-band system to which the present invention is applied, where the system is configured to provide for communications in accordance with two schemes, i.e., the GSM scheme and DCS 1800 scheme, the present invention can be utilized as well for permitting communications which involve phase modulation in accordance with the 8-PSK modulation mode, in addition to the GMSK modulation mode, in a triple-band system or a quad-band system which is configured to provide for communications in accordance with either the GSM scheme or DCS scheme, or in accordance with a PCS (Personal Communication System) 1900, GSM 850 scheme in addition to these schemes.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A radio communication apparatus comprising:
   a base band circuit which generates first signals to be transmitted;
   a high frequency integrated circuit which modulates the first signals;
   a power amplifier which amplifies a transmission signal; and
   a coupler which detects an output power of the power amplifier,
   wherein the high frequency integrated circuit includes:
      a modulator which performs phase modulation and amplitude modulation to the first signals;
      a phase detector which detects a phase component of an output of the modulator;
      an amplitude detector which detects an amplitude component of the output of the modulator;
      a feedback path which supplies a second signal corresponding to the output power of the power amplifier from the coupler to the amplitude detector;
      a forward path which supplies an output of the amplitude detector to the power amplifier;
      a variable gain amplifier which generates a control voltage for amplitude control based on the output of the amplitude detector to the power amplifier;
      a loop filter which is arranged between the amplitude detector and the variable gain amplifier and which sets a frequency bandwidth of an amplitude control loop, the amplitude control loop including the feedback path and the forward path; and
      a sequencer which generates control signals sequentially and supplying the control signals to associated circuits for operating the circuits in a predetermined order based on a command supplied from the base band circuit.

2. A radio communication apparatus according to claim 1, wherein
   the sequencer supplies the control signals to start a phase control loop while maintaining the amplitude control loop in an off state upon starting transmission, and to start the amplitude control loop after the phase control loop is stabilized.

3. A radio communication apparatus according to claim 1, further comprising:
   an oscillator which is arranged between the high frequency integrated circuit and the power amplifier and which oscillates in accordance with an output of the a phase detector and outputs the transmission signal.

4. A radio communication apparatus according to claim 1, wherein
   the high frequency integrated circuit is formed on a single semiconductor chip.

* * * * *